US007106231B2

(12) United States Patent
Smith et al.

(10) Patent No.: US 7,106,231 B2
(45) Date of Patent: Sep. 12, 2006

(54) VIDEO SIGNAL PROCESSING SYSTEM INCLUDING ANALOG TO DIGITAL CONVERTER AND RELATED METHOD FOR CALIBRATING ANALOG TO DIGITAL CONVERTER

(75) Inventors: Sterling Smith, Hsinchu (TW); Chia-Ming Yang, Hsin-Chu (TW); Chao-Ping Huang, Hsin-Chu (TW); Horng-Der Chang, Hua-Lien (TW); Henry Tin-Hang Yung, Hsin-Chu Hsien (TW)

(73) Assignee: MStar Semiconductor, Inc., Hsin-Chu Hsien (TW)

( * ) Notice: Subject to any disclaimer, the term of this patent is extended or adjusted under 35 U.S.C. 154(b) by 0 days.

(21) Appl. No.: 10/904,159

(22) Filed: Oct. 27, 2004

(65) Prior Publication Data

US 2005/0093722 A1  May 5, 2005

Related U.S. Application Data

(60) Provisional application No. 60/516,763, filed on Nov. 4, 2003.

(51) Int. Cl.
  *H03M 1/10* (2006.01)
  *H03M 1/12* (2006.01)
  *H04N 5/18* (2006.01)
(52) U.S. Cl. .................. 341/120; 348/572; 348/695
(58) Field of Classification Search ............ 341/118, 341/120, 131, 144; 348/229.1, 241, 243, 348/572, 673, 682, 691, 697, 465, 525, 528, 348/575, 692, 694, 695, 698, 180, 183; 379/88.27
See application file for complete search history.

(56) References Cited

U.S. PATENT DOCUMENTS

| | | | | |
|---|---|---|---|---|
| 3,699,256 A | * | 10/1972 | Roth | 348/528 |
| 4,410,876 A | * | 10/1983 | Sawagata | 348/572 |
| 4,424,528 A | * | 1/1984 | Karlock et al. | 348/575 |
| 4,456,927 A | * | 6/1984 | Marin | 348/525 |
| 4,568,980 A | * | 2/1986 | Yoshisato | 348/698 |
| 4,642,690 A | * | 2/1987 | Hinn | 348/673 |
| 4,752,825 A | * | 6/1988 | Buckley et al. | 348/192 |
| 4,811,016 A | * | 3/1989 | Millward et al. | 341/126 |
| 5,008,753 A | * | 4/1991 | Kitaura et al. | 348/695 |
| 5,057,920 A | * | 10/1991 | Wilkinson | 348/697 |
| 5,084,700 A | * | 1/1992 | Christopher | 341/118 |
| 5,245,341 A | * | 9/1993 | Maeder | 341/131 |
| 5,371,552 A | * | 12/1994 | Brummette et al. | 348/697 |
| 5,465,092 A | * | 11/1995 | Mayes et al. | 341/118 |
| 5,532,758 A | * | 7/1996 | Honma | 348/694 |
| 5,666,167 A | * | 9/1997 | Tults | 348/465 |
| 5,874,909 A | * | 2/1999 | Soenen et al. | 341/141 |
| 5,986,719 A | * | 11/1999 | Nakamura | 348/682 |
| 6,005,614 A | * | 12/1999 | Katayama | 348/241 |
| 6,057,891 A | * | 5/2000 | Guerin et al. | 348/572 |
| 6,127,955 A | * | 10/2000 | Handel et al. | 341/120 |
| 6,157,332 A | * | 12/2000 | Frank et al. | 341/144 |

(Continued)

*Primary Examiner*—Patrick Wamsley
(74) *Attorney, Agent, or Firm*—Winston Hsu (57) ABSTRACT

A video signal processing system capable of adjusting errors and related methods are introduced. The video signal processing system and related calibration methods utilize the characteristic of periodic breaks of video signals to perform various kinds of calibrations including gain calibration of ADC, offset calibration of ADC, dc-level shifting of input signals, and quatization errors spreading by adding analog random signals to input video signals. The required high accuracy in video signal processing systems is achieved in the present invention with the claimed calibration methods.

18 Claims, 7 Drawing Sheets

U.S. PATENT DOCUMENTS

| | | | |
|---|---|---|---|
| 6,339,435 B1 * | 1/2002 | Kim | 345/690 |
| 6,445,330 B1 * | 9/2002 | Thomsen et al. | 341/172 |
| 6,490,005 B1 * | 12/2002 | Steinbach et al. | 348/572 |
| 6,507,373 B1 * | 1/2003 | Lee | 348/692 |
| 6,603,416 B1 * | 8/2003 | Masenas et al. | 341/120 |
| 6,707,492 B1 * | 3/2004 | Itani | 348/229.1 |
| 6,791,607 B1 * | 9/2004 | Bilhan et al. | 348/243 |
| 6,867,717 B1 * | 3/2005 | Ion et al. | 341/118 |
| 6,885,396 B1 * | 4/2005 | Panicacci et al. | 348/241 |
| 6,956,621 B1 * | 10/2005 | Movshovish et al. | 348/691 |
| 7,023,497 B1 * | 4/2006 | Fang et al. | 348/694 |
| 7,034,722 B1 * | 4/2006 | Thomas | 341/120 |

* cited by examiner

VIDEO SIGNAL PROCESSING SYSTEM INCLUDING ANALOG TO DIGITAL CONVERTER AND RELATED METHOD FOR CALIBRATING ANALOG TO DIGITAL CONVERTER

CROSS REFERENCE TO RELATED APPLICATIONS

The application claims the benefit of U.S. Provisional Application No. 60/516,763, filed Nov. 4, 2003, and included herein by reference.

BACKGROUND OF INVENTION

1. Field of the Invention

The present invention generally relates to a video signal processing system and related method for calibrating an analog to digital converter of the video signal processing system. More specifically, the present invention relates to a video signal processing system and related method for calibrating analog to digital converter when video signals have no content during a horizontal blanking period.

2. Description of the Prior Art

Analog to digital converters (ADC) are utilized broadly in signal processing systems for converting analog signals into digital signals. Calibrations of ADCs are usually accomplished before hardwares of the ADCs leave the factory. However, the performance of ADC is distorted as long as the ADC is used.

Figure 1:
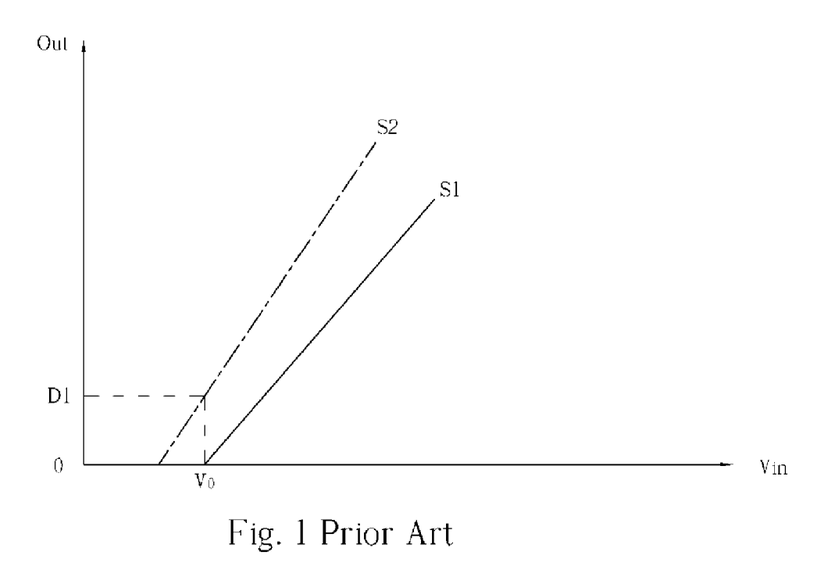
FIG. 1 is a diagram of response of a prior art ADC.

Please refer to FIG. 1. FIG. 1 is a diagram of response of a prior art ADC. In FIG. 1, the transverse axis represents voltage levels of input analog signals, and the vertical axis represents magnitudes of output digits. Line S1 is the ideal response of the prior art ADC, and line S2 is the real response of the prior art ADC after being used for a period of time. First of all, the slopes of line S1 and line S2 are different. Second, the offset of the response of the prior art ADC drifts an amount of D1. These distortions decrease the accuracy of ADCs seriously. Besides, the shifts of dc-level of input signals can also ruin the performance of the ADC.

In video signal processing systems, such as TVs, digital TVs, etc., performance and accuracy of ADCs are very important for the quality of displaying images. Due to the lack of ability to calibrate the ADCs dynamically after the ADCs leave the factory, video signal processing systems can do nothing about the degradation of performance of ADCs.

SUMMARY OF INVENTION

It is therefore a primary objective of the present invention to provide methods for calibrating an analog to digital converter (ADC) of a video signal processing system and the video signal processing systems that are capable of performing these methods.

Briefly described, the claimed invention discloses a method for calibrating an ADC of a video signal processing system. The method includes calibrating the ADC when video signals have no content during a horizontal blanking period.

The claimed invention further discloses a method for adjusting voltage levels of video signals to be inputted to an ADC of a video system. The method includes connecting the ADC to a clamp reference voltage to charge a capacitor when video signals are in black level during a horizontal blanking period, and disconnecting the ADC from the clamp reference voltage before video signals have content during a horizontal blanking period.

The claimed invention further discloses a method for improving accuracy of an ADC of a video system. The method includes adding an analog random signal to video signals input to the ADC.

The claimed invention further discloses a video signal processing system capable of adjusting voltage levels of video signals to be inputted to an ADC. The video signal processing system includes an ADC; a clamp switch having a first end coupled to an input of the ADC, and a second end for receiving a clamp reference voltage; and a capacitor having a first end coupled to the input of the ADC, and a second end for receiving video signals.

The claimed invention further discloses a video signal processing system capable of calibrating an offset of an ADC. The video signal processing system includes an ADC; an input switch having a first end coupled to an input of the ADC, and a second end for receiving video signals; a clamp switch having a first end coupled to the input of the ADC, and a second end for receiving a clamp reference voltage; and a calibration logic coupled to the ADC for adjusting an offset of the ADC according to digital signals output from the ADC when the input switch is switched off to stop the ADC from receiving video signals and the clamp switch is switched on to input the clamp reference voltage to the ADC.

The claimed invention further discloses a video signal processing system capable of calibrating a gain of an ADC. The video signal processing system includes an ADC; an input switch having a first end coupled to an input of the ADC, and a second end for receiving video signals; a first reference switch having a first end coupled to the input of the ADC, and a second end for receiving a first reference voltage; a second reference switch having a first end coupled to the input of the ADC, and a second end for receiving a second reference voltage; and a calibration logic coupled to the ADC for adjusting a gain of the ADC according to digital signals output from die ADC when the input switch is switched off to stop the ADC from receiving video signals, and the first reference switch is switched on to input the first reference voltage to the ADC; and digital signals output from the ADC when the input switch is switched off to stop the ADC from receiving video signals, and the second reference switch is switched on to input the second reference voltage to the ADC respectively.

The claimed invention further discloses a video signal processing system for improving accuracy of an ADC. The video signal processing system includes an analog random signal source for generating analog random signals, an adder coupled to the analog random signal source for adding the analog random signals to video signals, and an ADC coupled to the adder for converting output signals of the adder into digital signals.

The claimed invention further discloses a video signal processing system for improving accuracies of an ADC. The video signal processing system includes an ADC; a low pass filter for filtering input signals: a clamp switch having a first end coupled to an input of the low pass filter, and a second end for receiving a clamp reference voltage; a capacitor having a first end coupled to the input of the low pass lifter, and a second end for receiving video signals; a calibration logic coupled to the ADC; an adder coupled to the calibration logic for adding the analog random signals generated by the calibration logic to video signals input to the adder, or bypassing video signals input to the adder directly; an input switch having a first end coupled to an input of the adder, and a second end coupled to an output of the low pass filter; an offset switch having a first end coupled to the input of the adder, and a second end for receiving a offset reference voltage; a first reference switch having a first end coupled to the input of the adder, and a second end for receiving a first reference voltage; and a second reference switch having a first end coupled to the input of the adder, and a second end for receiving a second reference voltage; wherein the calibration logic is capable of adjusting an offset of the ADC according to digital signals output from the ADC when the input switch is switched off to stop the ADC from receiving video signals and the offset switch is switched on to input the clamp reference voltage to the ADC; adjusting a gain of the ADC according to digital signals output from the ADC when the input switch is switched off to stop the ADC from receiving video signals, and the first reference switch is switched on to input the first reference voltage to the ADC, and digital signals output from the ADC when the input switch is switched off to stop the ADC from receiving video signals, and the second reference switch is switched on to input the second reference voltage to the ADC respectively; and controlling the adder to add analog random signals to input signals or bypassing the input signals out directly.

The claimed invention further discloses a video signal processing system for improving accuracies of a plurality of analog to digital converters (ADC). The video signal processing system includes a calibration logic and a plurality of ADC channels. Each ADC channel includes an ADC coupled to the calibration logic; a low pass filter for filtering input signals; a clamp switch having a first end coupled to an input of the low pass filter, and a second end for receiving a clamp reference voltage; and a capacitor having a first end coupled to the input of the low pass filter, and a second end for receiving video signals; an adder coupled to the calibration logic for adding the analog random signals generated by the calibration logic to video signals input to the adder, or bypassing out video signals input to the adder directly; an input switch having a first end coupled to an input of the adder, and a second end coupled to an output of the low pass filter; an offset switch having a first end coupled to the input of the adder, and a second end for receiving a offset reference voltage; a first reference switch having a first end coupled to the input of the adder, and a second end for receiving a first reference voltage; and a second reference switch having a first end coupled to the input of the adder, and a second end for receiving a second reference voltage. The calibration logic is capable of selecting an ADC channel from the plurality of ADC channels according to a predetermined rule for calibrating the ADC of the selected ADC channel, adjusting an offset of the ADC of the selected ADC channel according to digital signals output from the ADC of the selected ADC channel when the input switch of the selected ADC channel is switched off to stop the ADC of the selected ADC channel from receiving video signals and the offset switch of the selected ADC channel is switched on to input the clamp reference voltage to the ADC of the selected ADC channel; adjusting a gain of the ADC of the selected ADC channel according to digital signals output from the ADC of the selected ADC channel when the input switch of the selected ADC channel is switched off to stop die ADC of the selected ADC channel from receiving video signals input to the selected ADC channel, and the first reference switch of the selected ADC channel is switched on to input the first reference voltage to the ADC of the selected ADC channel, and digital signals output from the ADC of the selected ADC channel when the input switch of the selected ADC channel is switched off to stop the ADC of the selected ADC channel from receiving video signals, and the second reference switch of the selected ADC channel is switched on to input the second reference voltage to the ADC of the selected ADC channel respectively; and controlling the adder of the selected ADC channel to add analog random signals to signals input to the selected ADC channel or bypass the signals input to the selected ADC channel directly.

These and other objectives of the present invention will no doubt become obvious to those of ordinary skill in the art after reading the following detailed description of the preferred embodiment that is illustrated in the various figures and drawings.

DETAILED DESCRIPTION

In most video signal processing systems, especially like TVs, digital TVs and HDTVs, there are periodic breaks for performing horizontal synchronizations in video signals that are to be processed to display images. The periodic breaks which include a front porch period, a horizontal sync pulse and a back porch period are called horizontal/vertical sync periods (or so called horizontal/vertical blanking periods) here. During horizontal/vertical blanking periods, video signals have no content and the video signal processing system displays video images of a lowest gray level accordingly. The characteristic of horizontal sync periods in video signals provides a good chance to temporarily disconnect the ADC of the video signal processing system from input video signals to apply calibration reference voltages in order to accurately measure gain and offset errors and perform other calibrations.

Figure 2:
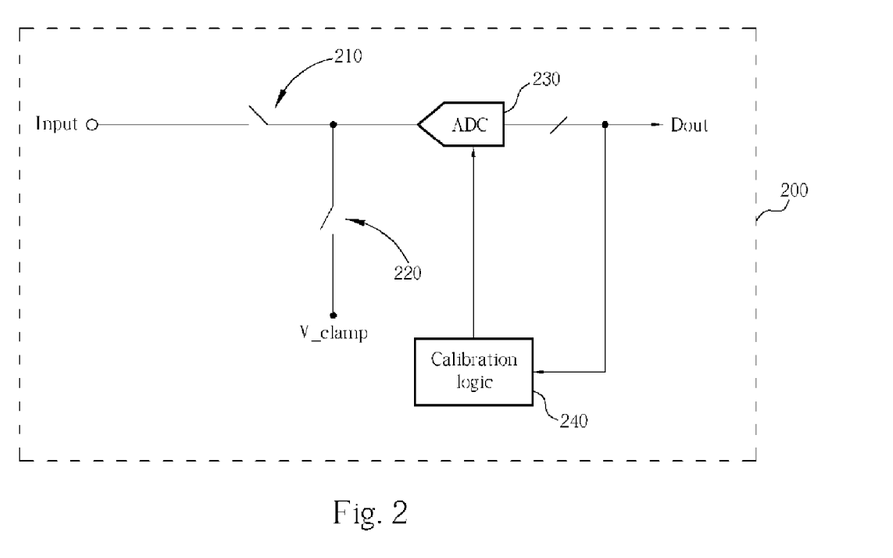
FIG. 2 is a block diagram of the first embodiment of the present invention video signal processing system.

Please refer to FIG. 2. FIG. 2 is a block diagram of the first embodiment of the present invention video signal processing system 200. In the present invention video signal processing system 200, one end of input switch 210 is coupled to ADC 230, and another end of input switch 210 is for receiving input video signals; one end of offset switch 220 is coupled to the ADC as well, and another end of offset switch 220 is for receiving a clamp reference voltage V_clamp, which is corresponding to a clamp level of video images to be processed; and calibration logic 240 is coupled to ADC 230 for adjusting an offset of ADC 230 according to output digits Dout of ADC 230. When input video signals have no content during a horizontal blanking period, since the video signal processing system only displays images of the lowest gray level stably, the present invention video signal processing system 200 can disconnect ADC 230 from video signals to be input, and display images of the lowest gray level automatically. Therefore, in the offset calibration of the present invention, input switch 210 is switched off to stop ADC 230 from receiving video signals and offset switch 220 is switched on to input the clamp reference voltage to ADC 230 during horizontal blanking periods. The offset of ADC 230 is then obtained according to the comparison of the real output of ADC 230 and the expected output of ADC 230 when inputting the clamp reference voltage V_clamp. Calibration logic 240 plays a role of figuring out the offset error to be calibrated in the present offset calibration. Calibration logic 240 performs operations to find out the offset error and generates commands to adjust the offset of ADC 230 according to the output of ADC 230 when the input of ADC 230 is the clamp reference voltage V_clamp. It may be designed tat the calibration logic 240 outputs commanding digits to ADC 230, and ADC 230 converts the commanding digits into analog signals and adjusts the offset according to the analog signals. Besides, it may he designed that the calibration logic 240 comprises a digital to analog convener (DAC) for outputting analog command to ADC 230 directly as well. This way, the offset of ADC 230 can be adjusted according to the analog command from calibration logic 240 directly. The offset calibration can be accomplished by adjusting circuit settings ADC 230, or can be performed by shifting the video signals to be input to ADC 230 in advance. After calibration logic 240 figures out the calibration setting, offset switch 220 is switched off and input switch 210 is switched on so as to re-connect ADC 230 with video signals, and the offset of ADC 230 is calibrated under the command of calibration logic 240. In application, calibration logic 240 may figure out the offset error according to a multiple number of Douts that are obtained during a multiple number of different horizontal blanking periods. In each horizontal blanking period, the aforementioned procedure of stopping ADC 230 from receiving input video signals and applying clamp reference voltage V_clamp to ADC 230 is performed so as to obtain a digital output Dout. The average of the multiple number of Douts will be taken to estimate the offset error. In addition, the clamp reference voltage V_clamp is corresponding to a lowest gray level of video images to be processed by the ADC to be calibrated. For example, if the ADC is converting Y signals, then the corresponding clamp reference voltage should be at the lowest expected input signal, which should correspond an ADC output of 0. As another example, also for the YUV input video signals, the clamp reference voltage for U signals is at the middle of the signal input range, which corresponds to 0% saturation, e. g. no color. So the clamp reference voltage V_clamp for calibrating offset error of the ADC that converts the U signals appropriately corresponds to 128 for an 8-bit ADC. Furthermore, for enabling detection of a low offset condition, the clamp reference voltage may be a little higher than the predetermine voltage corresponding to the clamp level of video images to keep the output level of ADC 230 sufficiently above zero.

Figure 3:
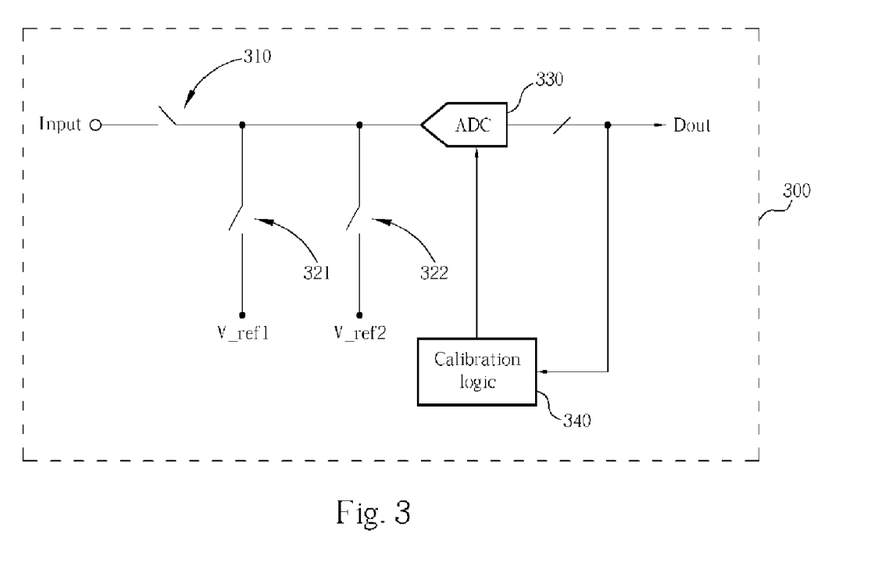
FIG. 3 is a block diagram of the second embodiment of the present invention video signal processing system.

The present invention provides gain calibration of the ADC as well. Please refer to FIG. 3. FIG. 3 is a block diagram of the second embodiment of the present invention video signal processing system 300. In the present invention video signal processing system 300, there is an input switch 310 playing the same role as the input switch 210 in the video signal processing system 200. There are two reference switches 321 and 322 for calibrating gain of ADC 330 in the present invention video signal processing system 300. The first reference switch 321 has a first end coupled to the input of ADC 330, and a second end for receiving a first reference voltage V_ref1. The second reference switch 322 has a first end coupled to the input of ADC 330 as well, and a second end for receiving a second reference voltage V_ref2. The first reference voltage V_ref1 and the second reference voltage V_rer2 are two predetermined values between a lowest voltage level and a highest voltage level of video images to be input to the ADC 330. A calibration logic 340 is coupled to the ADC 330 for adjusting a gain of the ADC 330 according to output digits Dout of the ADC 330. As described above, when input video signals have no content during a horizontal blanking period, the present invention video signal processing system 300 can disconnect the ADC 330 from video signals to be input, and display images of the lowest gray level automatically. Therefore, in the gain calibration of the present invention, it is designed that, during horizontal blanking periods, the input switch 310 is switched off to stop the ADC 330 from receiving video signals and the first reference switch 321 is switched on to input the first reference voltage V_ref1 to the ADC 330 so as to generate a first output signal Dout 1 first. Secondly, the first reference switch 321 is switched off and the second reference switch 322 is switched on to input the second reference voltage V_ref2 to the ADC 330 so as to generate a second output signal Dout2, while the input switch 310 is remained switched off. The gain of the ADC 330 is then obtained according to the comparison of the difference between the first output signal Dout1 and the second output signal Dout2 and the difference between V_ref1 and V_ref2. The calibration logic 340 plays a role of estimating the gain error to be calibrated in the gain calibration. By comparing the obtained gain of ADC 330 and the expected gain, the calibration logic 340 finds out the gain error and generates commands to adjust the gain of the ADC 330. As mentioned above, it may be designed that the calibration logic 340 outputs commanding digits to the ADC 330, and the ADC 330 converts the commanding digits into analog signals and adjusts the gain according to the converted analog signals. It may also be designed that the calibration logic 340 comprises a DAC for outputting analog commands to the ADC 330 directly as well. This way, the ADC 330 can adjust its gain according to the analog command from the calibration logic 340 without performing digital-to-analog conversion. The present method of gain calibration can be accomplished by calibrating circuit settings of the ADC 330, or can be performed by adjusting the video signals to be input to the ADC 330 in advance, for example, inserting an amplifier before the input of the ADC 330. After the calibration logic 340 figures out the calibration setting, the input switch 310 is switched on so as to connect the ADC 330 with input video signals, and the gain of the ADC 330 is therefore calibrated under the command of the calibration logic 340. In a preferred embodiment, the calibration logic 340 may average differences of a plurality of sets of Dout1 and Dout2 so as to obtain the average gain of the ADC 340. And the calibration 340 can compare the average gain of the ADC 340 with the expected gain for estimating the gain error to be calibrated.

Figure 4:
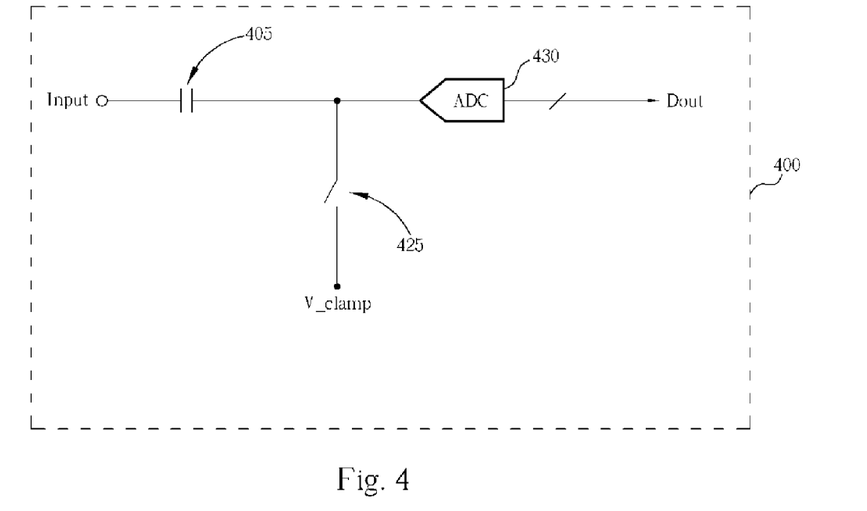
FIG. 4 is a block diagram of the third embodiment of the present invention video signal processing system.

Besides distortions in the internal circuit of the ADC, dc levels of video signals may drift in the system before entering the ADC. The variation of dc levels will destroy the conversion of ADC. Therefore, a calibration of do levels of input video signals is highly preferred for improving performance of an ADC. The claimed invention introduces a video signal processing system and related method for serving to dc-shift input video signals to a predetermined level that marches the input range of the ADC. Please refer to FIG. 4. FIG. 4 is a block diagram of the third embodiment of the present invention video signal processing system 400. The present invention video signal processing system 400 comprises a capacitor 405, a clamp switch 425, and an ADC

430. For adjusting dc-levels of input video signals, the clamp switch 425 is switched on to connect ADC 430 with a clamp reference voltage V_clamp, which corresponds to the predetermined dc-level of video signals, when video signals are in black level during a horizontal blanking period. The clamp reference voltage V_clamp charges clamp capacitor 405 and when the clamp switch 425 is switched on so as to forms a dc voltage across the ac-coupling clamp switch 425 for providing an appropriate dc-shift. When the charging is completed, the clamp switch 425 is switched off to disconnect the ADC from the clamp reference voltage v_clamp, hence the input to the ADC 430 becomes high-impedance. Since the high impedance prevents current flow into the clamp capacitor 405, the same dc-shift is kept across the clamp capacitor. Therefore, the video signals input to ADC 430 are added with voltage potential across capacitor 405, and the do levels arc adjusted to the predetermined value, that is, V_clamp, in consequence.

Figure 5:
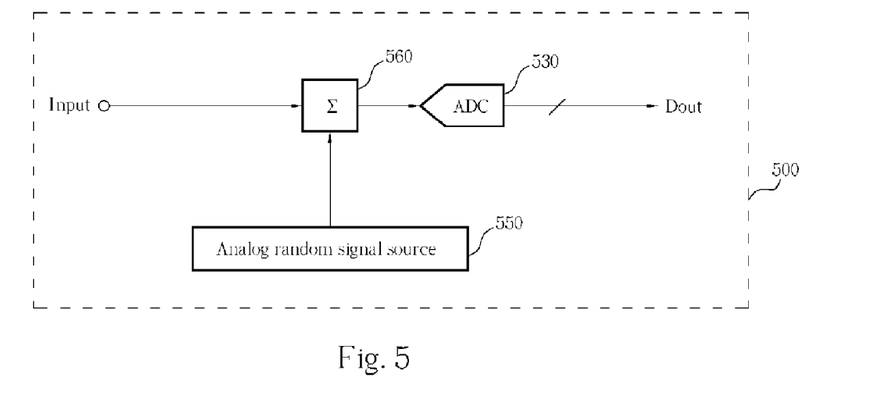
FIG. 5 is a block diagram of the fourth embodiment of the present invention video signal processing system.

Besides signal distortion and ADC conversion error, sometimes inaccuracies exist due to the limited digits in the adapted ADC, namely ADC quantization error. For example, if an input signal lies in a voltage level corresponding to 1.51 in digital domain, the ADC will always determine the input signal 2 since 1.51 is more than 1.5 and output a value of 2. The accumulated output error will be quite large and not able to be calibrated then. The present invention hence further provides a method named dithering for reducing such inaccuracy. Please refer to FIG. 5. FIG. 5 is a block diagram of the fourth embodiment of the present invention video signal processing system 500. The present invention video signal processing system 500 comprises an analog random signal source 550 for generating analog random signals, an adder 560 coupled to the analog random signal source 550 for adding the analog random signals to input video signals, and an ADC 530 coupled to the adder 560 for converting output signals of the adder 560 into digital signals. By adding analog random signal, the signals input to the ADC 530 will become a sequence of non-identical values, such as 1.52, 1.48, 1.53, 1.49, and etc. The ADC 530 output a digital sequence of 2, 1, 2, 1, and etc., then the average value 1.5 are more close to real value. This way, the ADC quantization error is spread uniformly over the ADC quantization step, and the determination of the input signal in average will be more accurate than the determination in the conventional system without adding analog random signals. Further, a digital multi-bit pseudo-random noise generator applied with a DAC may be utilized to realize the analog random signal source 550.

Figure 6:
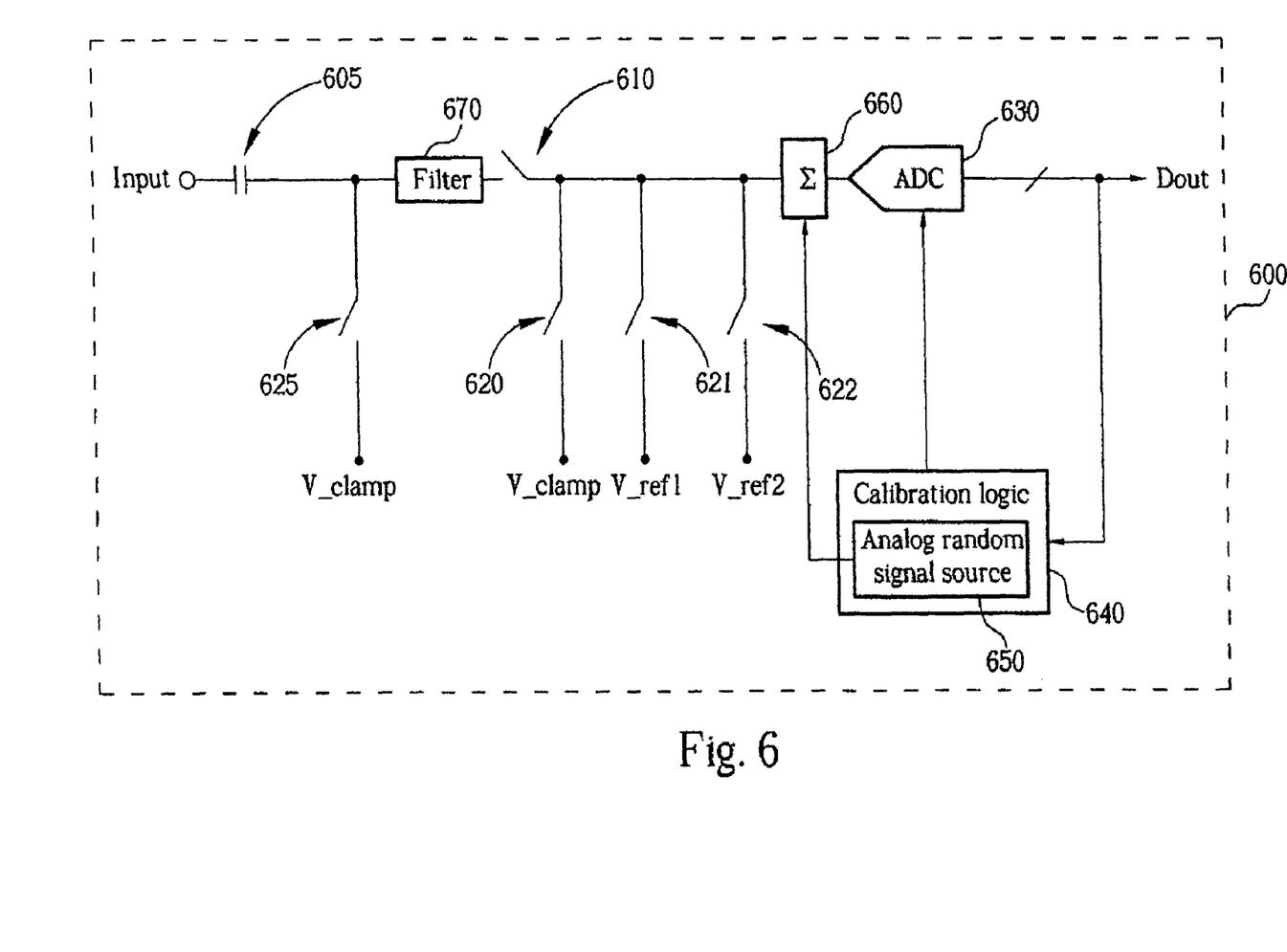
FIG. 6 is a block diagram of the fifth embodiment of the present invention video signal processing system.

The multiple calibration functions provided by the present invention can be implemented in a video signal processing system together. Please refer to FIG. 6. FIG. 6 is a block diagram of the fifth embodiment of the present invention video signal processing system 600. The aforementioned calibration functions are all integrated in the video signal processing system 600. A multi-functional calibration logic 640 is utilized to control and switch on/off different calibrations. An input switch 610 and an offset switch 620 together with the calibration logic 640 accomplish the offset calibration of an ADC 630. The input switch 610 further helps the gain calibration of the ADC 630 with the cooperation of reference switches 621 and 622 and the calibration logic 640. A clamp capacitor 605 and a clamp switch 625 serve the dc-level adjusting of input video signals. The calibration logic 640 further comprises an analog random signal source 650 providing analog random signals to an adder 660, the adder 660 adding the analog random signals to input video signals. Accordingly, the claimed dithering mechanism is realized by the adder 660 and the calibration logic 640, in which the analog random signal source 650 is integrated. As illustrated in FIG. 6, a low pass filter (LPF) 670 is added in the input path of the ADC 630. Then the LPF 670 added in the digital offset correction loop can remove most of the quantization error, resulting in a more precise estimation of the actual ADC offset. The dithering for spreading the quantization error of input video signal can be performed when the input video signals have content or not. When the input video signals have content, the analog random signal added to the input video signals help to improve the offset accuracy and overcome quantization errors. When the input video signals have no content, the analog random signal added to the input video signals (which are internal reference voltages here) can help to improve accuracy of the calibration being performed as well. In addition, the adder 660 can bypass input signals directly under the control of the calibration logic 640. The dc-level shifting can be performed in every horizontal blanking period. And for the gain calibration and the offset calibration, the calibration logic 640 can switch the tasks in a predetermined order. For example, the gain calibration and the offset calibration can be performed in different horizontal blanking periods by turns.

Figure 7:
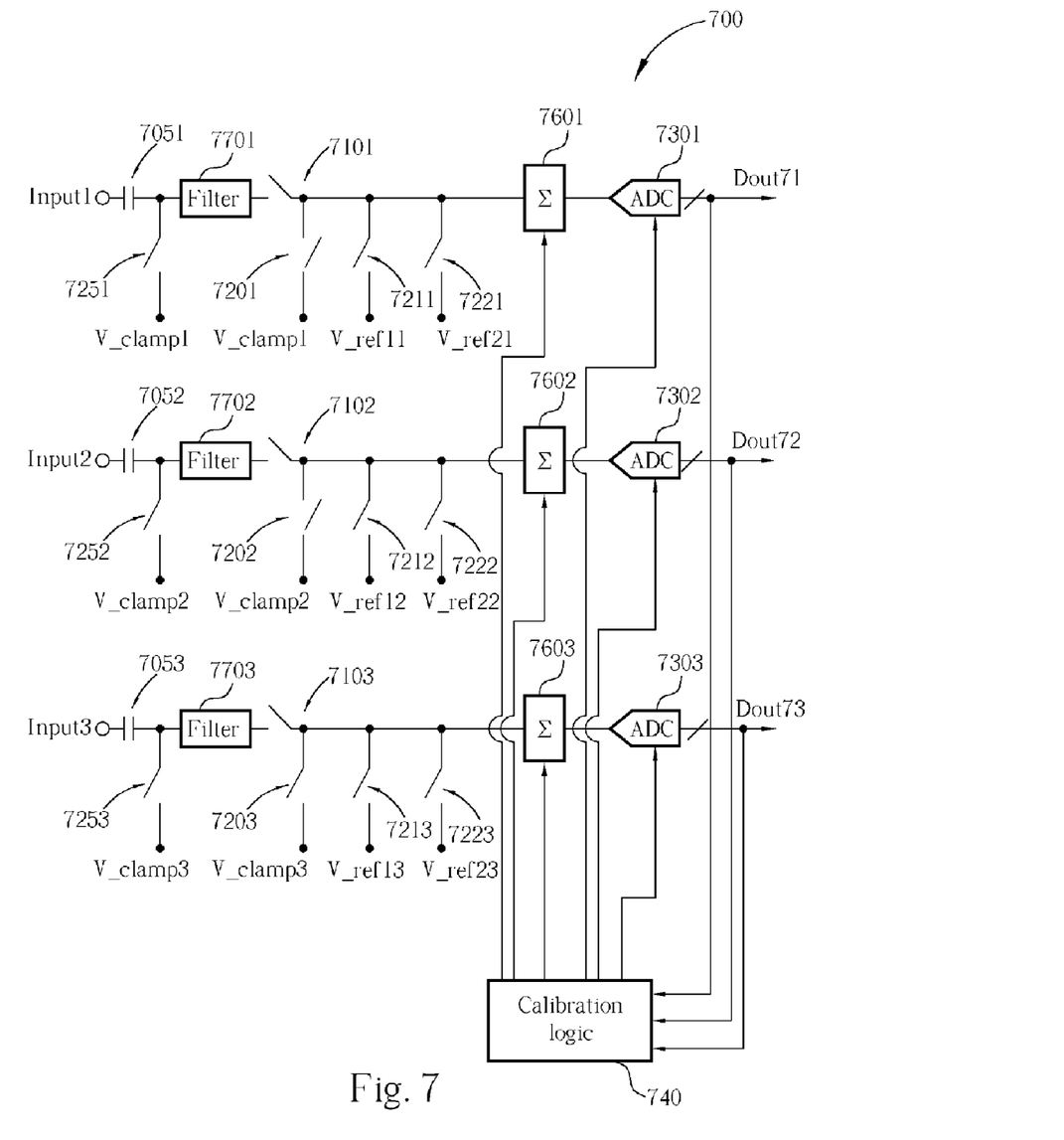
FIG. 7 is a block diagram of the sixth embodiment of the present invention video signal processing system.

The YUV or RGB signals in video signal processing systems arc processed separately. Accordingly, the function of the calibration logic in the present invention is further expanded to handle calibration tasks of different ADCs. Please refer to FIG. 7. FIG. 7 is a block diagram of the sixth embodiment of the present invention video signal processing system 700. Three ABCs 7301, 7302 and 7303 are utilized for convening Y, U and V signals respectively. The devices for performing offset calibration, gain calibration, input dc-level shifting, and dithering are duplicated for serving the calibration tasks for the different ABCs. The clamp reference voltages V_clamp1, V_clamp2 and V_clamp3, the first reference voltages V_ref11, V_ref12 and V_ref13, and the second reference voltages V_ref21, V_ref22 and V_ref23 are appropriately chosen for different kinds of video signals respectively. However, only one calibration logic 740 is utilized in the embodiment to handle and command the calibrations. The dc-level shifting for different video signals can be performed independently. The dithering for spreading out quantization errors can be performed individually as well. And the gain calibration and the offset calibration of the different ABCs can be performed in different horizontal blanking periods in turn under the control of the calibration logic 740. Therefore, the cost of hardware of the video signal processing system capable of calibrating errors dynamically is reduced.

In summary, the present invention utilizes the characteristic of periodic breaks of video signals, that is, front porch periods, horizontal blanking pulses and back porch periods, to perform various calibrations of video signal processing systems, including gain calibration of ADC, offset calibration of ADC, and input dc-level shifting. The present invention also provides dithering to add analog random signals to input video signals for spreading out quantization errors. The present video signal processing system may comprise a plurality of ADCs for convening different categories of signals. It is allowed in the present invention to utilize only one calibration logic to perform calibrations for each ADC in turn for reducing the cost of the claimed video signal processing system. The required accuracy of video signals is achieved easily in the present video signal processing and with related calibration methods.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for calibrating art analog to digital converter (ADC) of a video signal processing system comprising:
    disconnecting the ADC from a video input;
    inputting a first reference voltage to the ADC so as to generate a first output signal;
    inputting a second reference voltage to the ADC so as to generate a second output signal; and
    dynamically calibrating a gain of the ADC during a blanking period according to the first output signal and the second output signal.

2. The method of claim 1 further comprising:
    adjusting voltage levels of video signals to be inputted to the ADC.

3. The method of claim 2 wherein adjusting voltage levels of video signals to be inputted to the ADC comprises:
    connecting the ADC to a clamp reference voltage to charge a capacitor when video signals are in black level during a horizontal line period; and
    disconnecting the ADC from the clamp reference voltage before video signals have content during a horizontal line period.

4. The method of claim 3 further comprising equalizing the clamp reference voltage to a voltage corresponding to a lowest gray level of video images.

5. The method of claim 1 further comprising:
    adding an analog random signal to the video signals.

6. The method of claim 5 further comprising:
    filtering the video signals.

7. The method of claim 1 wherein the blanking period is a horizontal blanking period.

8. The method of claim 1 wherein the blanking period includes a front porch period, a sync pulse and a back porch period.

9. A method for calibrating an analog to digital converter (ADC) of a video signal processing system comprising:
    disconnecting the ADC from a video input;
    inputting a clamp reference voltage to the ADC so as to generate an output signal; and
    dynamically calibrating an offset of the ADC during a blanking period according to the output signal.

10. The method of claim 9 wherein the blanking period is a horizontal blanking period.

11. The method of claim 9 wherein the blanking period includes a front porch period, a sync pulse and a back porch period.

12. A video signal processing system capable of dynamically calibrating an analog to digital converter (ADC) comprising:
    an ADC;
    a clamp switch for receiving a clamp reference voltage;
    a capacitor coupled to the clamp switch for receiving a video signal;
    a calibration logic coupled to the ADC;
    an adder coupled to said ADC and the calibration logic for adding an analog random signal to said video signal;
    an input switch coupled to the ADC and said capacitor; and
    an offset switch coupled to the adder;
    wherein the calibration logic is capable of dynamically calibrating an offset of the ADC.

13. The video signal processing system of claim 12 further comprising:
    a first reference switch coupled to the adder for receiving a first reference voltage; and
    a second reference switch coupled to the adder for receiving a second reference voltage.

14. The video signal processing system of claim 13 wherein the calibration logic dynamically calibrates a gain of the ADC according to a digital signal output from the ADC.

15. The video signal processing system of claim 14 wherein the input switch is switched off to stop the ADC from receiving the video signal when the first reference switch is switched on to input the first reference voltage to the ADC and the second reference switch is switched on to input the second reference voltage to the ADC.

16. The video signal processing system of claim 12, wherein the calibration logic comprises an analog random signal source for generating said analog random signal.

17. The video signal processing system of claim 12 further comprising a low pass filter coupled between said capacitor and said input switch for low passing said video signal.

18. The video signal processing system of claim 12 wherein the input switch is switched off to stop the ADC from receiving the video signal when the offset switch is switched on to input the clamp reference voltage to the ADC.

* * * * *